(12) United States Patent
Kim et al.

(10) Patent No.: US 6,194,263 B1
(45) Date of Patent: Feb. 27, 2001

(54) METHODS FOR FORMING CAPACITOR STRUCTURES INCLUDING ETCHING PITS

(75) Inventors: Young-sun Kim; Young-wook Park, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 08/729,232

(22) Filed: Oct. 9, 1996

(30) Foreign Application Priority Data

Oct. 10, 1995 (KR) .................................................. 95-34751
Sep. 25, 1996 (KR) .................................................. 96-42688

(51) Int. Cl.[7] .............................................. H01L 21/8242
(52) U.S. Cl. ...................... 438/255; 438/253; 438/396; 438/398
(58) Field of Search ........................... 257/309; 438/253, 438/255, 396, 398, 947, 964

(56) References Cited

U.S. PATENT DOCUMENTS

| 5,234,862 | 8/1993 | Aketagawa et al. | 437/103 |
|---|---|---|---|
| 5,330,614 | 7/1994 | Ahn | 156/631 |
| 5,366,917 | 11/1994 | Watanabe et al. | 437/47 |
| 5,372,962 | 12/1994 | Hirota et al. | 437/47 |
| 5,385,863 | 1/1995 | Tatsumi et al. | 437/109 |
| 5,394,012 | 2/1995 | Kimura | 257/739 |
| 5,405,801 | 4/1995 | Han et al. | 437/60 |
| 5,464,791 | 11/1995 | Hirota | 437/60 |
| 5,486,488 | 1/1996 | Kamiyama | 437/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,616,511 | 4/1997 | Hirota | 438/396 |
| 5,623,243 | 4/1997 | Watanabe et al. | 257/309 |
| 5,679,596 | * 10/1997 | Lu | 438/396 |
| 5,723,373 | * 3/1998 | Chang et al. | 438/253 |
| 5,726,085 | * 3/1998 | Crenshaw et al. | 438/255 |
| 5,759,891 | * 6/1998 | Tseng | 438/253 |
| 5,795,806 | * 8/1998 | Tseng | 438/255 |
| 5,821,152 | * 10/1998 | Han et al. | 438/398 |
| 5,869,368 | * 2/1999 | Yew et al. | 438/255 |
| 5,913,119 | * 6/1999 | Lin et al. | 438/255 |
| 5,930,625 | * 7/1999 | Lin et al. | 438/253 |
| 5,966,612 | * 10/1999 | Wu | 438/398 |
| 5,972,771 | * 10/1999 | Figura | 438/398 |

FOREIGN PATENT DOCUMENTS 4-286151 10/1992 (JP) .

OTHER PUBLICATIONS

H. Wanatabe et al., *A New Cylindrical Capacitor Using Hemispherical Grained Si (HSG–Si) for 256Mb DRAMs,* 1992 IEEE, IEDM 92, Apr. 1992, 10.1.1–10.1.4. pp. 259–262.

* cited by examiner

Primary Examiner—Carl Whitehead, Jr.
Assistant Examiner—Toniae M. Thomas
(74) Attorney, Agent, or Firm—Myers Bigel Sibley & Sajovec

(57) ABSTRACT

A method for forming an electrode structure includes the steps of forming a conductive electrode on the microelectronic substrate, forming HSG-silicon seeds on the surface of the conductive electrode, and etching the conductive electrode using the HSG-silicon seeds as a mask so that pits are formed between the HSG-silicon seeds. In addition, the HSG-silicon seeds on the conductive electrode can be grown to form enlarged HSG-silicon bumps on the conductive electrode further increasing the surface area thereof. Related structures are also discussed.

19 Claims, 4 Drawing Sheets

METHODS FOR FORMING CAPACITOR STRUCTURES INCLUDING ETCHING PITS

FIELD OF THE INVENTION

The present invention relates to the field of integrated circuit devices and more particularly to methods for forming capacitor structures for integrated circuit devices.

BACKGROUND OF THE INVENTION

As dynamic random access memories (DRAMs) become more highly integrated, the area available for each memory cell generally decreases thus resulting in smaller memory cell capacitors. Decreases in the memory cell capacitance may thus reduce the stability of a memory device. In particular, a decrease in the memory cell capacitance may lower the read and write tolerances for the memory cell, increase a soft error rate, and make low voltage operations more difficult. Accordingly, there continues to exist a need in the art to provide memory cell capacitors which maintain a sufficient capacitance despite reductions in surface area available for the capacitor.

In general, a 64 Mb DRAM may have a memory cell area of approximately 1.5 $\mu m^2$. Accordingly, it may be difficult to provide a sufficient memory cell capacitance even when using a two-dimensional stacked capacitor structure with a dielectric material such as $Ta_2O_5$. Three-dimensional capacitor structures have thus been suggested to increase the memory cell capacitance. For example, a capacitor electrode having a fin structure has been suggested by Fujitsu, a capacitor electrode having a box structure has been suggested by Toshiba, and a capacitor electrode having a cylindrical structure has been suggested by Mitsubishi.

The fabrication of a capacitor with a three-dimensional structure, however, may be difficult, and defects may occur. Research has also been directed toward the development of dielectric materials with high dielectric constants which can be used to increase the capacitance of a memory cell capacitor. These materials with high dielectric constants, however, may also be difficult to fabricate in a memory device.

Research has also been directed toward methods for fabricating ridge and valley type lower electrodes wherein a surface area of an electrode is increased thus increasing the capacitance. For example, multiple bumps of hemispherical grained-silicon (HSG-Si) can be formed on the surface of a capacitor electrode to form ridges and valleys on the surface of the electrode thereby increasing the surface area of the electrode. Several methods are known for forming hemispherical grained-silicon bumps on electrodes. First, a chemical vapor deposition step can be used to deposit silicon at a temperature where a phase transformation from amorphous silicon to polysilicon occurs. Second, amorphous silicon can be annealed without a native oxide layer in a vacuum. Third, a seeding step can be used to form hemispherical grained-silicon (HSG-Si) bumps using a low pressure chemical vapor deposition (LPCVD) with $SiH_4$ gas or $Si_2H_6$ gas, or by irradiating a beam of $SiH_4$ or $Si_2H_6$ on amorphous silicon. These seeds can then be grown to form enlarged HSG-Si bumps.

In particular, it has been reported that the surface area of a capacitor electrode can be increased using the seeding method to form a ridge and valley type structure. See, H. Watanabe et al., *A New Cylindrical Capacitor Using Hemispherical Grained Si (HSG-Si) For 256 Mb DRAMs*, IEDM, 1992, pp. 259–262.

FIGS. 1 through 3 are cross-sectional views illustrating steps of a method for fabricating a capacitor for a DRAM according to the prior art. As will be understood by one having skill in the art, a dynamic random access memory includes a plurality of memory cells, and each memory cell includes a storage electrode and a memory cell access transistor which connects the memory cell capacitor to a bit line in response to an activation signal on a word line. As shown, the memory cell access transistor includes a source/drain region 12 and a gate made up of gate electrode 16 and a gate insulating layer 14. A second source/drain of the memory cell access transistor is connected to a bit line, and a word line is connected to the gate electrode 16.

As shown in FIG. 1, an insulating layer 20 such as a silicon oxide layer is formed on the semiconductor substrate 10 and the memory cell access transistor. The insulating layer is then patterned using a photolithographic technique to form a contact hole exposing a portion of the semiconductor substrate 10. In particular, the contact hole exposes the source/drain 12 of the memory cell access transistor.

A doped amorphous silicon layer is then formed on the insulating layer 20, and this insulating layer 20 fills the contact hole to make electrical contact with the substrate 10. This silicon layer can then be patterned to provide the capacitor electrode 40 having a cylindrical structure. This capacitor electrode 40 is thus connected to the source/drain 12 of the memory cell access transistor through the contact hole.

Hemispherical grained-silicon seeds 50a and 50b are respectively grown on the capacitor electrode 40 and the insulating layer 20 as shown in FIG. 2. In particular, the HSG-Si seeds can be formed on the capacitor electrode 40 using a low pressure chemical vapor deposition (LPCVD) technique with a silicon source gas. Because the HSG-Si seeds are formed first at a portion of the capacitor electrode 40 with a relatively high surface energy, the HSG-Si seeds will be scattered on the surface of the capacitor electrode 40. In addition, the silicon source gas can include $SiH_4$, $Si_2H_6$, $Si_3H_8$, $SiH_2Cl_2$, or $SiH_2Cl_2$. Alternately, the HSG-Si seeds may be formed on the capacitor electrode 40 by irradiating a beam of the silicon source gas on the surface of the substrate including the capacitor electrode 40.

Because the selectivity of HSG-Si seed formation is relatively low, the HSG-Si seeds may be formed on the insulating layer 20 in addition to the capacitor electrode 40. Accordingly, HSG-Si seeds on the capacitor electrode 40 will be identified by the reference number 50a, and HSG-Si seeds formed on the insulating layer 20 will be identified with the reference number 50b.

The structure is then heated to selectively grow the HSG-Si seeds 50a on the capacitor electrode 40 thus forming the enlarged HSG-Si bumps 50c on the capacitor electrode 40 as shown in FIG. 3. Accordingly, the surface area of the capacitor electrode 40 can be increased. Because the HSG-Si seeds 50a on the capacitor electrode 40 grow by receiving silicon from the capacitor electrode 40 and because the HSG-Si seeds 50b on the insulating layer 20 do not receive the silicon required for growth, only the HSG-Si seeds 50a on the capacitor electrode 40 grow to form the enlarged HSG-Si bumps 50c.

As further shown in FIG. 3, the HSG-Si seeds 50b remain on the insulating layer 20. Accordingly, adjacent capacitor electrodes may be electrically shorted by the HSG-Si seeds 50b on the insulating layer 20 resulting in misoperations of the memory device. In addition, it may be difficult to obtain a desired cell capacitance because the increase in surface area of the capacitor electrode is dependent on the growth of the HSG-Si seeds 50a.

A dielectric layer and a second capacitor electrode are then formed on the first capacitor electrode 40. The dielectric layer and the second electrode may extend across the surface covering multiple first capacitor electrodes 40.

As discussed above, the HSG-Si seeds 50b on the insulating layer 20 may remain so that adjacent capacitor electrodes 40 may be susceptible to electric shorts. In addition, further increases in memory cell capacitance may be desired to provide still greater memory cell capacitance. Accordingly, there continues to exist a need in the art for improved methods for forming capacitor structures for memory devices.

SUMMARY OF THE INVENTION

It is therefore an object of the present invention to provide improved methods for forming capacitor structures.

It is another object of the present invention to provide methods for forming a capacitor having increased capacitance.

It is still another object of the present invention to provide methods for forming dynamic random access memory devices having increased memory cell capacitance.

These and other objects are provided according to the present invention by methods including the steps of forming a conductive electrode on a microelectronic substrate, forming HSG-silicon seeds on the surface of the conductive electrode, and etching the conductive electrode using the HSG-silicon seeds as a mask so that pits are formed between the HSG-silicon seeds. Accordingly, the surface area of the conductive electrode can be increased thus allowing an increase in the capacitance of a capacitor formed with the electrode.

Furthermore, the microelectronic substrate can be a semiconductor substrate and the step of forming the conductive electrode can be preceded by the step of forming an insulating layer on the semiconductor substrate. In particular, the insulating layer can have a contact hole therein exposing a portion of the semiconductor substrate, and the conductive electrode can be connected to the semiconductor substrate through the contact hole. When used to form a memory cell capacitor for a dynamic random access memory device, a memory cell access transistor is preferably formed in the semiconductor substrate wherein the memory cell access transistor includes a source and a drain at the surface of the semiconductor substrate. The contact hole exposes a source or a drain of the memory cell access transistor so that the capacitor electrode is connected thereto. Accordingly, memory cell capacitors can be provided for highly integrated memory devices while maintaining a sufficient memory cell capacitance.

In addition, the HSG-silicon seeds on the conductive electrode can be grown to form enlarged HSG-silicon bumps on the conductive electrode. The seeds can be grown by heating the conductive electrode and the seeds. If seeds are formed on both a polysilicon electrode and a surrounding insulating layer, the seeds on the polysilicon electrode can be grown selectively because silicon can be provided from the electrode to support the growth while silicon may not be provided from the insulating layer.

Accordingly, the step of forming the HSG-silicon seeds on the conductive electrode may also result in the formation of HSG-silicon seeds on the microelectronic substrate, and the HSG-silicon seeds on the microelectronic substrate may not grow significantly during the step of growing the HSG-silicon seeds on the conductive electrode. The HSG-silicon seeds on the microelectronic substrate can thus be selectively removed after growing the HSG-silicon seeds on the conductive electrode. An etching step can be used to remove the smaller HSG-silicon seeds on the microelectronic substrate without significantly etching the enlarged HSG-silicon bumps on the electrode. Shorts between conductive electrodes can thus be reduced.

The methods of the present invention can thus be used to increase the capacitance of a capacitor. In particular, by increasing the surface area of a given electrode, the capacitance can be increased without increasing the size of the electrode. These methods can thus be used to maintain a desired memory cell capacitance while decreasing a memory cell size. In addition, the methods of the present invention can be used to reduce shorts between adjacent capacitor electrodes.

DETAILED DESCRIPTION

Figure 1:
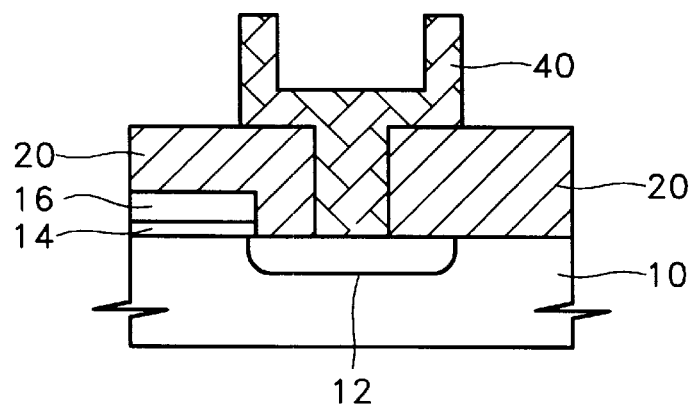
FIGS. 1 through 3 are cross-sectional views illustrating steps of a method for fabricating a capacitor according to the prior art.
Figure 2:
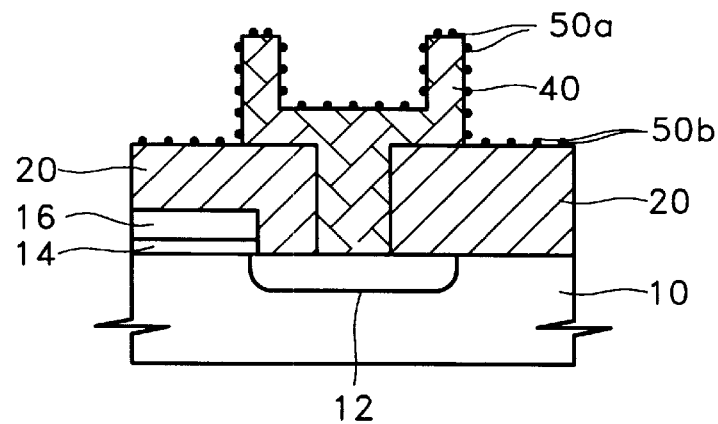
Figure 3:
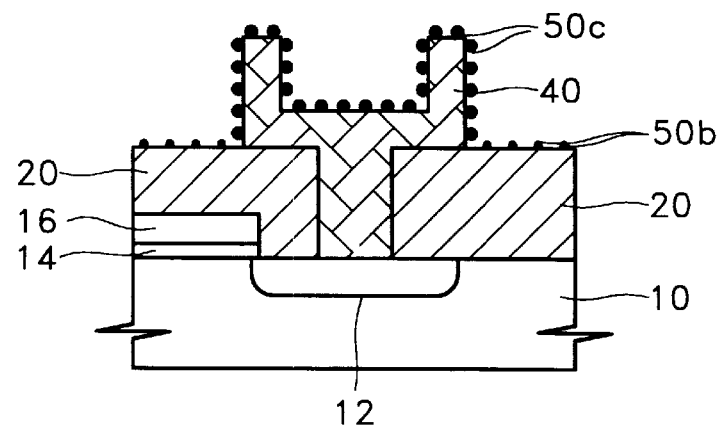
Figure 4:
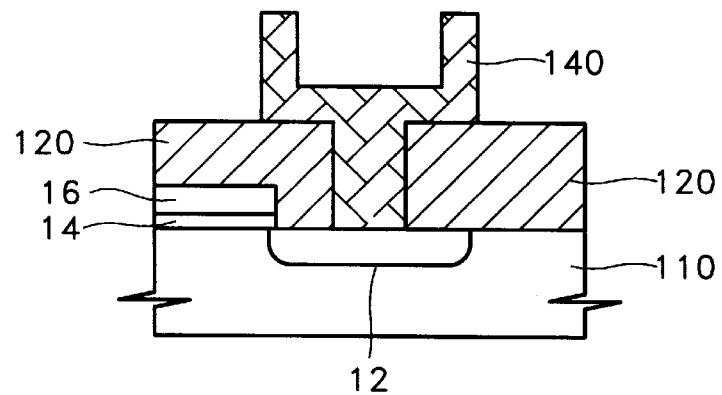
FIGS. 4 through 7 are cross-sectional views illustrating steps of a first method for forming a capacitor according to the present invention.
Figure 5:
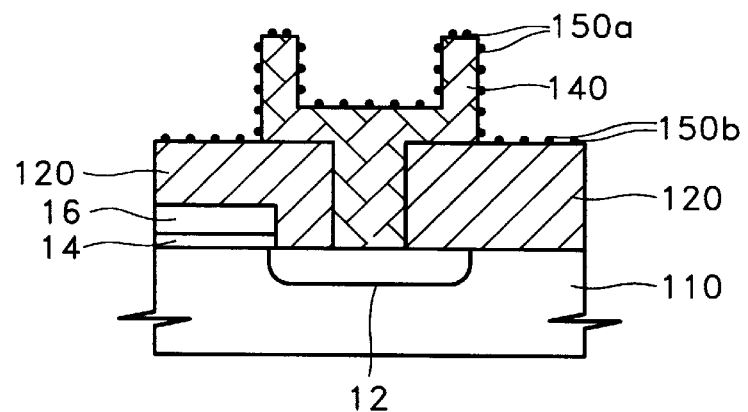

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

FIGS. 4–7 illustrate steps of a first method for forming a capacitor for a memory device according to the present invention. An insulating layer 120 is formed on the substrate 110, and a contact hole is formed in the insulating layer 120 exposing a portion of the substrate 110. In particular, the contact hole exposes a source/drain region 12 of a memory cell access transistor. The capacitor electrode 140 can be formed by depositing a layer of amorphous silicon and patterning the layer to produce the cylindrical structure shown in FIG. 4. As shown, the capacitor electrode is connected to the substrate through the contact hole.

Figure 6:
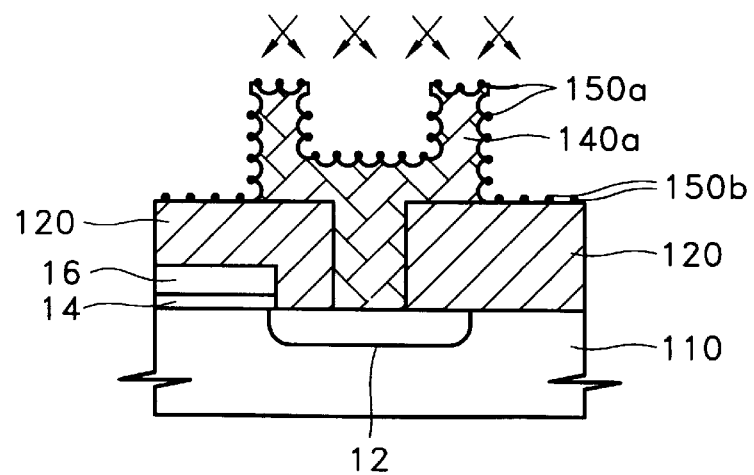

Hemispherical grained-silicon (HSG-Si) seeds 150a are formed on the capacitor electrode 140 and HSG-Si seeds 150b are formed on the insulating layer 120. Techniques for forming the HSG-Si seeds are discussed above in the Background of the Invention as well as in the reference by H. Watanabe et al. entitled *A New Cylindrical Capacitor Using Hemispherical Grained Si (HSG-Si) For 256 Mb DRAMs*, IEDM, 1992, pp. 259–262. The capacitor electrode 140 is then modified as shown in FIG. 6 to provide the modified capacitor electrode 140a. In particular, the surface of the lower electrode 140 is etched using the HSG-Si seeds 150a thereon as an etch mask to form pits on the surface of the capacitor electrode 140 between HSG-Si seeds 150a. Accordingly, the modified capacitor electrode 140a has pits between HSG-SI seeds 150a thus increasing the surface area of the electrode. This etch can be performed using an etch gas including chlorine such as $Cl_2$, $BCl_3$, $ClF_3$, and HCl.

The etch rate of the HSG-Si seeds 150a and 150b and the insulating layer 120 are low relative to the etch rate of the capacitor electrode 140 when using an etch gas including chlorine. Accordingly, the capacitor electrode 140 is etched more quickly than the insulating layer 120 or the HSG-Si seeds 150a and 150b. Preferably, the etch is anisotropic but the incident angle of the etch gas is varied during the etch. Accordingly, the pits in the capacitor electrode 140 can be more effectively formed to create an even larger surface area for the electrode.

Figure 7:
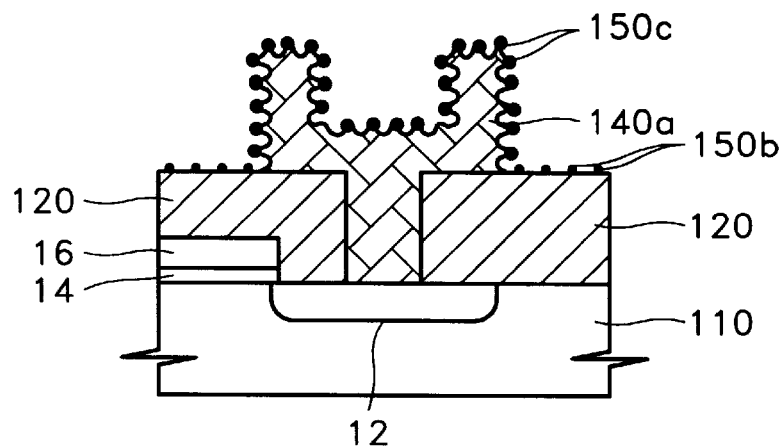

The HSG-Si seeds 150a are then grown to form the enlarged HSG-Si bumps 150c on the capacitor electrode 140, as shown in FIG. 7. The HSG-Si seeds 150a can be grown by heating the structure to a temperature in the range of 560° C. to 630° C. The HSG-Si seeds 150a grow selectively because silicon can be absorbed from the capacitor electrode 140. The HSG-Si seeds 150b on the insulating layer 120 may experience insignificant growth because silicon may not be available from the insulating layer.

Accordingly, the step of etching the capacitor electrode 140 to form pits between the HSG-Si seeds 150a can be used to further increase the surface area of the capacitor electrode thus further increasing the capacitance of the completed capacitor. In particular, the pits between HSG-Si seeds increase the distance between the peak of each ridge and the trough of each valley increasing the surface area of the capacitor electrode.

Figure 8:
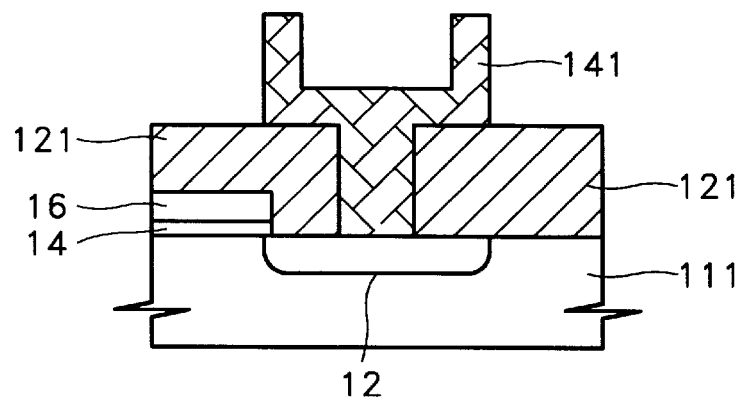
FIGS. 8 through 11 are cross-sectional views illustrating steps of a second method for forming a capacitor according to the present invention.
Figure 9:
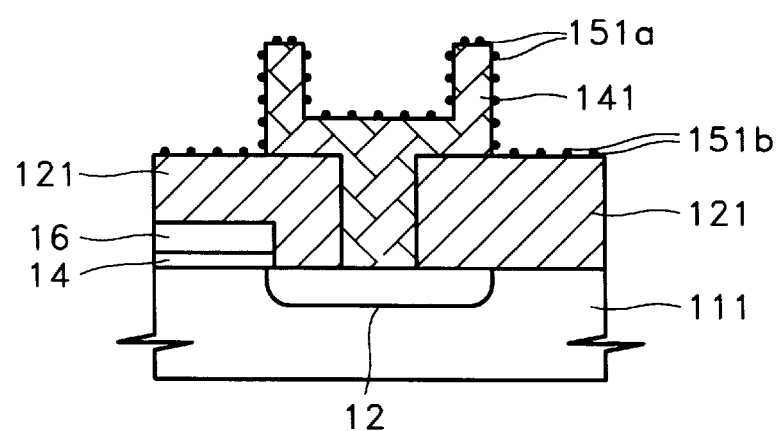

An alternate aspect of the present invention will now be discussed with reference to FIGS. 8 through 10. As shown in FIG. 8, an insulating layer 121 is formed on the substrate 111. As before, the insulating layer 121 covers a memory cell access transistor including the source/drain region 12, the gate insulating layer 14, and the gate electrode 16. A contact hole on the insulating layer exposes a portion of the substrate 111, and the capacitor electrode 141 is formed on the insulating layer 121. The capacitor electrode 141 makes contact with the substrate 111 through the contact hole in the insulating layer 121. Hemispherical grained-silicon (HSG-Si) seeds are formed on the capacitor electrode 141 and insulating layer 121 as shown in FIG. 9. The reference number 151a is used to identify HSG-Si seeds on the capacitor electrode 141, and the reference number 151b is used to identify HSG-Si seeds on the insulating layer 121. These elements are formed as discussed above with reference to FIGS. 4 and 5.

Figure 10:
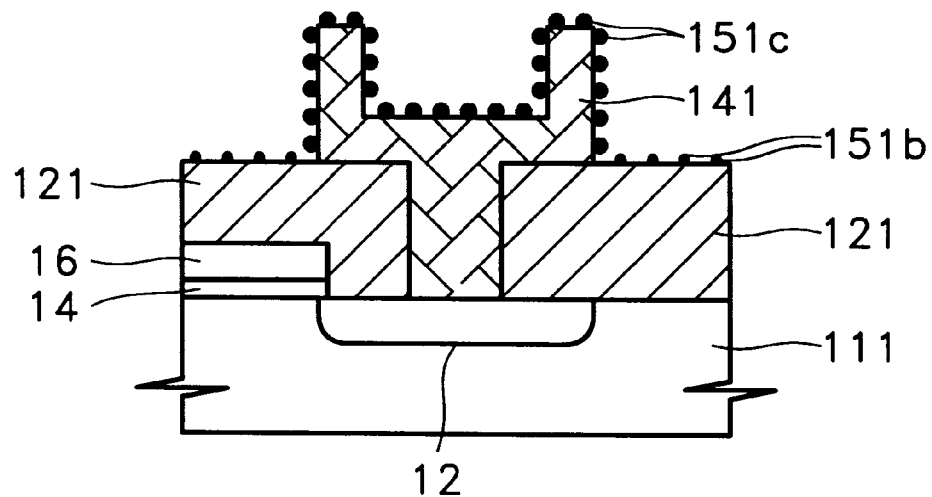

The HSG-Si seeds 151a are grown to form enlarged HSG-Si bumps 151c on the capacitor electrode 141 as shown in FIG. 10. In particular, the bumps are grown by heating the structure to a temperature in the range of 560° C. to 630° C. The HSG-Si seeds 151a on the capacitor electrode 141 are selectively grown because silicon is available from the capacitor electrode 141. The HSG-Si seeds 151b on the insulating layer 121 do not grow significantly because silicon is not available from the insulating layer 121.

Figure 11:
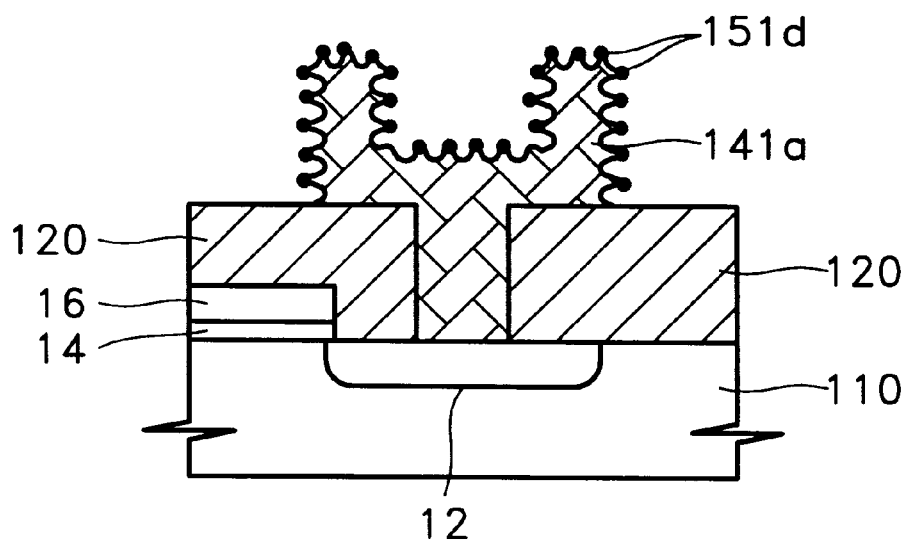

The HSG-Si seeds 151b on the insulating layer 121 are removed as shown in FIG. 11. In particular, the HSG-Si seeds 151b on the insulating layer can be removed by exposing the structure to an etch gas including chlorine. For example, the etch gas can be $Cl_2$, $BCl_3$, $ClF_3$, or HCl. By timing the etch, the HSG-Si seeds 151b on the insulating layer 121 can be removed without completely removing the larger HSG-Si bumps 151c on the capacitor electrode 141. The partially etched HSG-Si bumps on the capacitor electrode are identified by the reference number 151d as shown in FIG. 11. The partially etched capacitor electrode is identified by the reference number 141a. Accordingly, the surface area of the capacitor electrode can be increased thus increasing the capacitance of the capacitor formed thereby. As discussed above with regard to FIG. 7, etch pits between the HSG-Si bumps increase the surface area of the capacitor electrode.

In summary, the HSG-Si seeds 151a on the capacitor electrode are selectively grown, and the HSG-Si seeds 151b on the insulating layer are removed using an etch gas including chlorine. Accordingly, electrical shorts between adjacent capacitor electrodes can be reduced without significantly decreasing the capacitance thereof.

In addition, the HSG-Si seeds 150b on the insulating layer 120 of FIG. 7 can be removed using the etching step discussed above with regard to FIG. 10. Shorts between capacitor electrodes can thus be reduced.

In the methods discussed above, the surface area of a capacitor electrode can be increased thus allowing the formation of capacitors with higher capacitance. In addition, electrical shorts between adjacent capacitor electrodes can be reduced without resulting in a significant decrease in capacitance.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for forming a dynamic random access memory, said method comprising the steps of:

forming a memory cell access transistor on a semiconductor substrate wherein said memory cell access transistor includes a source/drain at the surface of the semiconductor substrate;

forming an insulating layer on said semiconductor substrate and said memory cell access transistor wherein said insulating layer has a contact hole therein exposing a portion of said source/drain of said memory cell access transistor;

forming a first capacitor electrode on said insulating layer wherein said first capacitor electrode is connected to said source/drain of said memory cell access transistor through said contact hole;

forming HSG-silicon seeds on the surface of said first capacitor electrode; and etching said first capacitor electrode using said HSG-silicon seeds as a mask so that pits are formed between said HSG-silicon seeds;

wherein said etching step comprises using an etching gas while varying an incident angle of said etching gas.

2. A method for forming a dynamic random access memory, said method comprising the steps of:

forming a memory cell access transistor on a semiconductor substrate wherein said memory cell access transistor includes a source/drain at the surface of the semiconductor substrate;

forming an insulating layer on said semiconductor substrate and said memory cell access transistor wherein said insulating layer has a contact hole therein exposing a portion of said source/drain of said memory cell access transistor;

forming a first capacitor electrode on said insulating layer wherein said first capacitor electrode is connected to said source/drain of said memory cell access transistor through said contact hole;

forming HSG-silicon seeds on the surface of said first capacitor electrode;

etching said first capacitor electrode using said HSG-silicon seeds as a mask so that pits are formed between said HSG-silicon seeds; and after etching said first capacitor electrode, growing said HSG-silicon seeds on said first capacitor electrode to form enlarged HSG-silicon bumps on said first capacitor electrode.

3. A method according to claim 2 wherein said step of growing said HSG-silicon seeds comprises heating said first capacitor electrode and said HSG-silicon seeds.

4. A method according to claim 3 wherein said step of growing said HSG-silicon seeds comprises heating said first capacitor electrode and said HSG-silicon seeds to a temperature in the range of 560° C. to 630° C.

5. A method according to claim 2:
wherein said step of forming HSG-silicon seeds comprises the steps of forming HSG-silicon seeds on the surface of said first capacitor electrode and forming HSG-silicon seeds on said insulating layer;
wherein said growing step comprises growing said HSG-silicon seeds on said first capacitor electrode without growing said HSG-silicon seeds on said insulating layer; and
wherein said growing step is followed by the step of removing said HSG-silicon seeds from said insulating layer.

6. A method according to claim 5 wherein said step of removing said HSG-silicon seeds from said insulating layer comprises etching said HSG-silicon seeds using an etching gas including chlorine.

7. A method according to claim 1 wherein said etching step is performed using an etching gas including chlorine.

8. A method according to claim 7 wherein said etching gas is chosen from the group consisting of $Cl_2$, $BCl_3$, $ClF_3$ and HCl.

9. A method according to claim 2 wherein said etching step comprises using an etching gas while varying an incident angle of said etching gas.

10. A method for forming an electrode structure on a microelectronic substrate, said method comprising the steps of:
forming a conductive electrode on the microelectronic substrate;
forming HSG-silicon seeds on the surface of the conductive electrode; and
etching said conductive electrode using said HSG-silicon seeds as a mask so that pits are formed between said HSG-silicon seeds;
wherein said etching step comprises using an etching gas while varying an incident angle of said etching gas.

11. A method for forming an electrode structure on a microelectronic substrate, said method comprising the steps of:
forming a conductive electrode on the microelectronic substrate;
forming HSG-silicon seeds on the surface of the conductive electrode; and
etching said conductive electrode using said HSG-silicon seeds as a mask so that pits are formed between said HSG-silicon seeds;
after etching said conductive electrode, growing said HSG-silicon seeds on said conductive electrode to form enlarged HSG-silicon bumps on said conductive electrode.

12. A method according to claim 11 wherein said step of growing said HSG-silicon seeds comprises heating said conductive electrode and said HSG-silicon seeds.

13. A method according to claim 12 wherein said step of growing said HSG-silicon seeds comprises heating said conductive electrode and said HSG-silicon seeds to a temperature in the range of 560° C. to 630° C.

14. A method according to claim 11:
wherein said step of forming HSG-silicon seeds comprises the steps of forming HSG-silicon seeds on the surface of said conductive electrode and forming HSG-silicon seeds on the microelectronic substrate;
wherein said growing step comprises growing said HSG-silicon seeds on said conductive electrode without growing said HSG-silicon seeds on the microelectronic substrate; and
wherein said growing step is followed by the step of removing said HSG-silicon seeds from the microelectronic substrate.

15. A method according to claim 14 wherein said step of removing said HSG-silicon seeds from the microelectronic substrate comprises etching said HSG-silicon seeds using an etching gas including chlorine.

16. A method according to claim 10 wherein said microelectronic substrate comprises a semiconductor substrate and wherein said step of forming said conductive electrode is preceded by the step of:
forming an insulating layer on the semiconductor substrate wherein said insulating layer has a contact hole therein exposing a portion of the semiconductor substrate and wherein said conductive electrode is connected to the semiconductor substrate through said contact hole.

17. A method according to claim 10 wherein said etching step is performed using an etching gas including chlorine.

18. A method according to claim 17 wherein said etching gas is chosen from the group consisting of $Cl_2$, $BCl_3$, $ClF_3$ and HCl.

19. A method according to claim 11 wherein said etching step comprises using an etching gas while varying an incident angle of said etching gas.

* * * * *